United States Patent
Hu et al.

(10) Patent No.: US 9,892,988 B2
(45) Date of Patent: Feb. 13, 2018

(54) SEMICONDUCTOR PACKAGING STRUCTURE AND MANUFACTURING METHOD FOR THE SAME

(71) Applicant: DAWNING LEADING TECHNOLOGY INC., Miao-Li (TW)

(72) Inventors: Yu-Shan Hu, Miao-Li (TW); Diann-Fang Lin, Miao-Li (TW)

(73) Assignee: Dawning Leading Technology Inc., Miao-Li (TW)

( * ) Notice: Subject to any disclaimer, the term of this patent is extended or adjusted under 35 U.S.C. 154(b) by 92 days.

(21) Appl. No.: 14/277,256

(22) Filed: May 14, 2014

(65) Prior Publication Data

US 2015/0228596 A1 Aug. 13, 2015

(30) Foreign Application Priority Data

Feb. 11, 2014 (TW) .............................. 103104391 A

(51) Int. Cl.
*H01L 23/48* (2006.01)
*H01L 23/31* (2006.01)
*H01L 23/00* (2006.01)

(52) U.S. Cl.
CPC .......... *H01L 23/3192* (2013.01); *H01L 24/03* (2013.01); *H01L 24/05* (2013.01); *H01L 24/13* (2013.01); *H01L 2224/02313* (2013.01); *H01L 2224/0345* (2013.01); *H01L 2224/03462* (2013.01); *H01L 2224/03602* (2013.01); *H01L 2224/0401* (2013.01); *H01L 2224/05006* (2013.01); *H01L 2224/05099* (2013.01); *H01L 2224/05546* (2013.01); *H01L 2224/05548* (2013.01); *H01L 2224/05567* (2013.01); *H01L 2224/05569* (2013.01); *H01L 2224/05571* (2013.01); *H01L 2224/05599* (2013.01); *H01L 2224/11334* (2013.01); *H01L 2224/13022* (2013.01); *H01L 2224/13099* (2013.01); *H01L 2924/12042* (2013.01)

(58) Field of Classification Search
CPC ......... H01L 24/11; H01L 24/14; H01L 24/03; H01L 24/05; H01L 23/3192
USPC .......................................... 257/737; 438/614
See application file for complete search history.

(56) References Cited

U.S. PATENT DOCUMENTS

| | | | |
|---|---|---|---|
| 7,977,783 B1 * | 7/2011 | Park ........................ | H01L 24/11 257/692 |
| 2007/0108591 A1 * | 5/2007 | Sunohara .............. | H01L 21/486 257/700 |
| 2008/0001290 A1 * | 1/2008 | Chou ................. | H01L 23/53238 257/751 |

(Continued)

*Primary Examiner* — Trung Q Dang
(74) *Attorney, Agent, or Firm* — Skaar Ulbrich Macari, P.A.

(57) ABSTRACT

A semiconductor packaging structure and a manufacturing method for the same are disclosed. The semiconductor packaging structure includes a chip, a dielectric layer and a plurality of redistribution circuit layers. The chip has a plurality of connection pads. The dielectric layer is disposed on the chip and defined with a plurality of containers therein. The connection pads are exposed from the containers, respectively. The redistribution circuit layers are disposed within the containers and electrically connected with the connection pads, respectively. Via these arrangements, the bonding surfaces between the redistribution circuit layers and the dielectric layer can be increased.

15 Claims, 9 Drawing Sheets

(56) References Cited

U.S. PATENT DOCUMENTS

| | | | |
|---|---|---|---|
| 2012/0061823 A1* | 3/2012 | Wu | H01L 23/3157 257/737 |
| 2013/0026650 A1* | 1/2013 | Yamagata | H01L 24/24 257/774 |
| 2014/0264863 A1* | 9/2014 | Huang | H01L 24/13 257/741 |
| 2015/0024530 A1* | 1/2015 | Lee | H01L 29/66477 438/34 |
| 2015/0235940 A1* | 8/2015 | Chen | H01L 23/528 257/759 |

* cited by examiner

SEMICONDUCTOR PACKAGING STRUCTURE AND MANUFACTURING METHOD FOR THE SAME

CROSS-REFERENCES TO RELATED APPLICATIONS

This application claims priority to Taiwan Patent Application No. 103104391 filed on Feb. 11, 2014, which is hereby incorporated herein by reference in its entirety.

BACKGROUND OF THE INVENTION

Field of the Invention

The present invention provides a semiconductor packaging structure and a manufacturing method for the same. In particular, the present invention provides a semiconductor packaging structure of a chip scale and a manufacturing method for the same.

Descriptions of the Related Art

As miniaturization of electronic products has become more common, semiconductor packaging structures have to be downsized as well. In current semiconductor packaging technologies, a semiconductor packaging structure packaged on a chip scale is preferred to satisfy the demand of downsizing.

Taiwan Patent NO. I251912 discloses a conventional wafer-level chip packaging structure 1 shown in FIG. 1. The conventional wafer-level chip packaging structure 1 generally comprises a wafer 11, a plurality of aluminum pads 12, a dielectric layer 13 and a plurality of redistribution circuit layers 14. The aluminum pads 12 are disposed on the wafer 11, while the dielectric layer 13 is formed on the wafer 11 and the aluminum pads 12. A plurality of openings is formed in the dielectric layer 13 to expose the aluminum pads 12. The redistribution circuit layers 14 are stacked on the dielectric layer 13 and electrically connected with the aluminum pads 12 respectively.

During the manufacturing process of the aforesaid conventional semiconductor packaging structure, usually at least two alignment steps are required: one is used to form the openings in the dielectric layer 13, and the other is used to form the redistribution circuit layers 14. As the number of alignment steps is increased, the overall manufacturing time of the semiconductor packaging structure is prolonged and the manufacturing cost is increased.

Additionally, the redistribution circuit layers 14 of the conventional semiconductor packaging structure are stacked on the dielectric layer 13, so only one surface of the redistribution circuit layers 14 is in contact with the dielectric layer 13. As such, the bonding force between the redistribution circuit layers 14 and the dielectric layer 13 is relatively poor so that the redistribution circuit layers 14 tend to peel off from the dielectric layer 13 during subsequent processes.

Accordingly, a need exists in the art to provide a semiconductor packaging structure which is capable of improving at least one of the aforesaid drawbacks and a manufacturing method for the same.

SUMMARY OF THE INVENTION

An objective of the present invention is to provide a semiconductor packaging structure and a manufacturing method for the same. In this semiconductor packaging structure, the area of the bonding surface between redistribution circuit layers and a dielectric layer can be increased.

To achieve the aforesaid objective, a method for manufacturing the semiconductor packaging structure provided in the present invention comprises the following steps: providing a chip which has a plurality of connection pads; providing a dielectric layer on the chip, wherein the dielectric layer covers the connection pads; removing parts of the dielectric layer to form a plurality of containers in the dielectric layer, wherein the connection pads are exposed from the containers respectively; and forming a plurality of redistribution circuit layers within the containers and electrically connecting the redistribution circuit layers with the connection pads respectively.

To achieve the aforesaid objective, a semiconductor packaging structure provided in the present invention comprises a chip, a dielectric layer and a plurality of redistribution circuit layers. The chip has a plurality of connection pads. The dielectric layer is disposed on the chip, a plurality of containers is defined within the dielectric layer, and the connection pads are exposed from the containers respectively. The redistribution circuit layers are disposed within the containers and electrically connected with the connection pads respectively.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The present invention provides a semiconductor packaging structure and a manufacturing method for the same. Hereinafter, the semiconductor packaging structure of the present invention will be described in detail.

Figure 1:
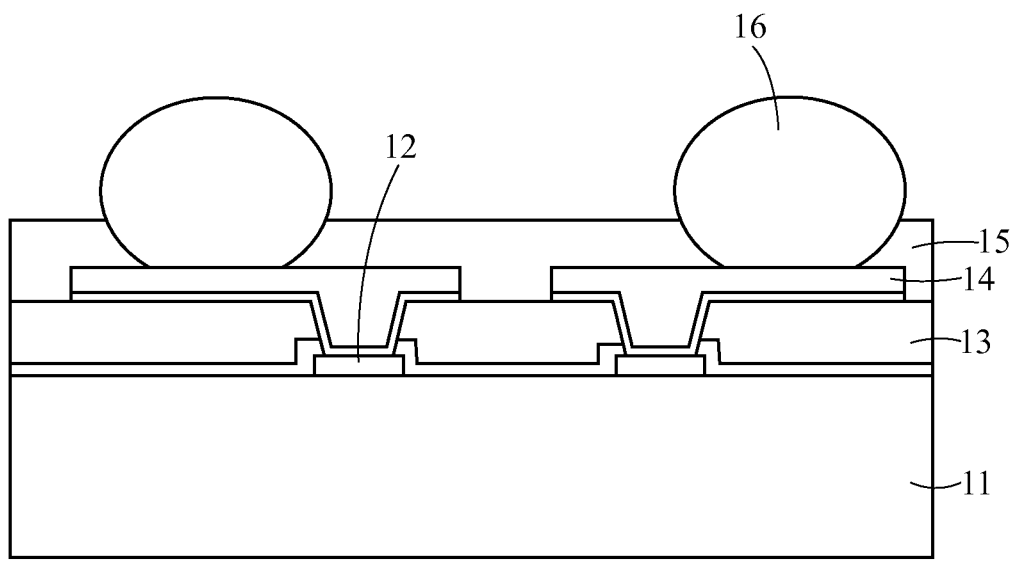
FIG. 1 is a schematic view of a conventional semiconductor packaging structure.
Figure 2:
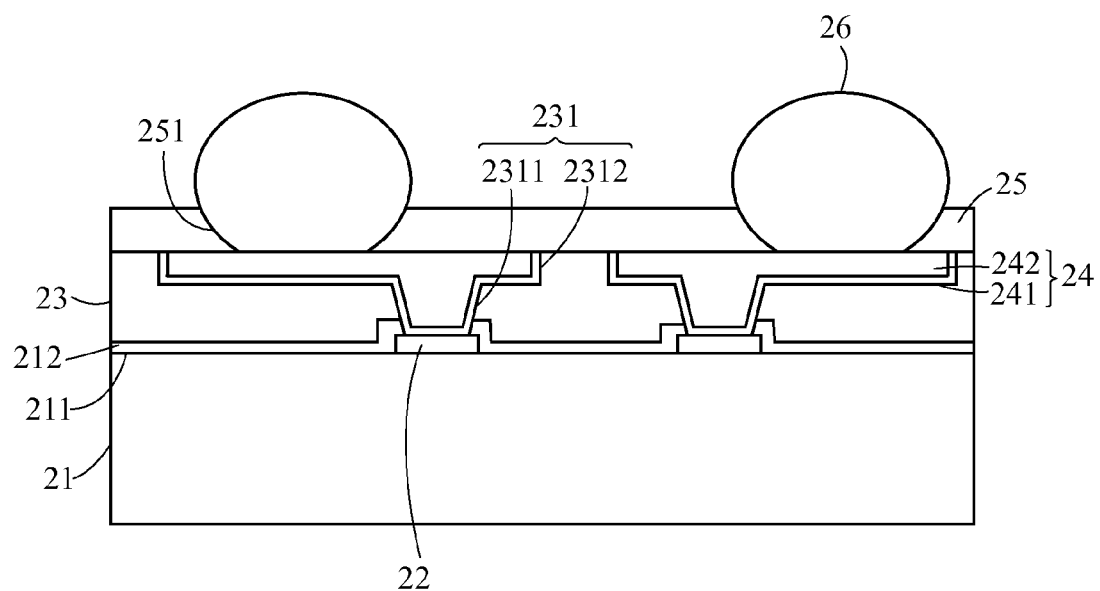
FIG. 2 is a schematic view of the first embodiment of the semiconductor packaging structure of the present invention.

FIG. 2 is a schematic view of the first embodiment of the semiconductor packaging structure of the present invention. The semiconductor packaging structure 2 comprises the following: a chip 21, a dielectric layer 23, a plurality of redistribution circuit layers 24, a protective layer 25 and a plurality of bumps 26. Hereinbelow, these components will be described sequentially.

The chip 21 is a chip in which an integrated circuit (not shown) has been formed through a semiconductor process. The chip 21 has a plurality of connection pads 22 (only two connection pads are shown in this embodiment as an example). The connection pads 22 are formed on an upper surface (as known as an active surface) 211 of the chip 21 and may be aluminum pads. The chip 21 may further comprise a protective layer 212. The protective layer 212 is also formed on the upper surface 211 of the chip 21 and covers the periphery of the connection pads 22.

In consideration of possible circuit distribution of the redistribution circuit layers 24, the redistribution circuit layers 24 can extend to areas (not shown) beyond the upper surface of the chip 21 if necessary, instead of being limited to the upper surface of the chip 21. In this case, by dispersively rearranging the chips 21 through the use of selecting equipment to generate specific intervals between the chips 21 and by disposing at least one kind of filling material (not shown) within the intervals between the chips 21, a dispersively arranged wafer form or panel form is constructed, and the circuit distribution demands of the redistribution circuit layers 24 can be satisfied.

The dielectric layer 23 is disposed on the chip 21, and can cover the protective layer 212 of the chip 21. A plurality of containers 231 is defined within the dielectric layer 23 (reference can be made to FIG. 4C for more clear viewing of the shapes and positions of the containers), and each of the containers 231 comprises a through portion 2311 and a blind portion 2312 that communicates with each other. Both the through portions 2311 and the blind portions 2312 are recessed from the upper surface of the dielectric layer 23. The through portions 2311 further extend to the lower surface of the dielectric layer 23.

Because the through portions 2311 extend through the dielectric layer 23 and are disposed above the connection pads 22 respectively, the connection pads 22 can be exposed from the containers 231 respectively. Therefore, if no material is provided within the containers 231, the connection pads 22 can be observed from the containers 231.

The redistribution circuit layers 24 may be disposed within the containers 231 (i.e. within the through portions 2311 and the blind portions 2312) respectively so that the redistribution circuit layers 24 are recessed into the dielectric layer 23 and surrounded by the dielectric layer 23. As such, all other surfaces than the upper surface of the redistribution circuit layers 24 can come into contact with the dielectric layer 23. Moreover, the redistribution circuit layers 24 can fill up the containers 231 depending on practical applications so that the upper surface of the redistribution circuit layers 24 and the upper surface of the dielectric layer 23 are coplanar (as shown in this embodiment). Alternatively, the redistribution circuit layers may not fill up the containers (not shown) or may further protrude outside the containers after filling up the containers (not shown).

When the redistribution circuit layers 24 are disposed within the containers 231, the redistribution circuit layers 24 can come into contact with and electrically connected to the "connection pads 22 exposed in the containers 231" respectively.

Each of the redistribution circuit layers 24 may include a metal seed layer 241 and a first metal layer 242. The metal seed layers 241 are in contact with the connection pads 22 and the dielectric layer 23. The first metal layers 242, which are thicker than the metal seed layers 241, are formed on the metal seed layers 241. In other embodiments (not shown), the redistribution circuit layers may also include only the first metal layers, in which case the first metal layers make direct contact with the connection pads and the dielectric layer. Furthermore, each of the redistribution circuit layers may include a second metal layer (not shown) formed on the first metal layers to protect the first metal layers by virtue of barrier characteristics generated by the different materials. In this way, potential degradation in electrical reliability due to subsequent processes can be avoided.

The protective layer 25 (as known as the solder mask) is disposed on the dielectric layer 23 and the redistribution circuit layers 24. A plurality of recesses 251 is defined within the protective layer 25 (reference can be made to FIG. 4G for more clear viewing of the shapes and positions of the recesses). The recesses 251 extend through the protective layer 25 and are disposed above the redistribution circuit layers 24 respectively so that the redistribution circuit layers 24 can be exposed from the recesses 251 respectively. Additionally, the recesses 251 may be offset from the connection pads 22 respectively in a horizontal direction so that the recesses 251 are not right above the connection pads 22 (i.e., centers of the recesses 251 and the connection pads 22 are not on the same vertical line).

The bumps 26 are disposed in the recesses 251 respectively. The bumps 26 come into contact with and are electrically connected with "the redistribution circuit layers 24 exposed in the recesses 251." Since the recesses 251 are offset from the connection pads 22 in the horizontal direction, the bumps 26 in the recesses 251 are also offset from the connection pads 22 in the horizontal direction. Therefore, if an external force is applied to the bumps 26, the force will not act on the connection pads 22 directly so that the connection pads 22 are less likely to be damaged.

In some implementations, the semiconductor packaging structure 2 may further comprise a plurality of under-bump-metal (UBM) layers (not shown). The UBM layers are disposed between the redistribution circuit layers 24 and the bumps 26 respectively. That is, the UBM layers are disposed within the recesses 251 and are in contact with and electrically connected with the redistribution circuit layers 24 respectively. While the bumps 26 are disposed on the UBM layers and electrically connected with the redistribution circuit layers 24 via the UBM layers respectively.

As compared with conventional semiconductor packaging structures, the semiconductor packaging structure 2 of this embodiment has an increased bonding area between the redistribution circuit layers 24 and the dielectric layer 23 instead of having only one planar bonding surface therebetween. In this way, the bonding force between the redistribution circuit layers 24 and the dielectric layer 23 may be increased so that the redistribution circuit layers 24 will not easily peel off from the dielectric layer 23 easily during subsequent manufacturing processes.

Hereinafter, other preferred embodiments of the semiconductor packaging structure of the present invention will be described. Portions of the other preferred embodiments similar to the first preferred embodiment will not be further described for clarity.

Figure 3:
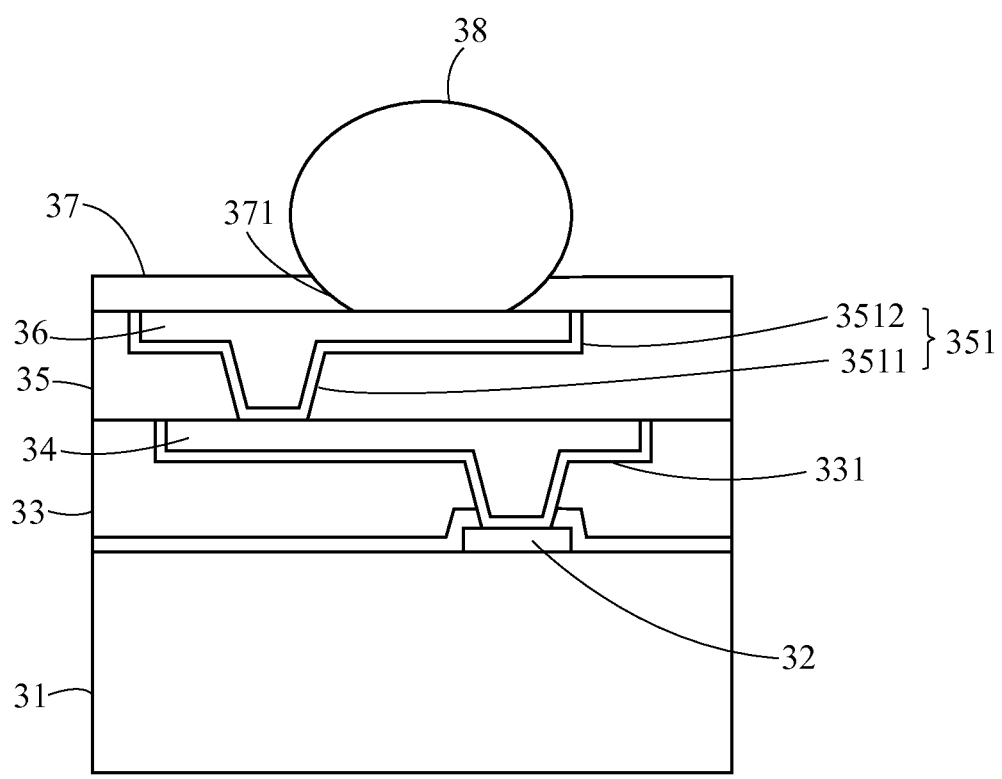
FIG. 3 is a schematic view of the second embodiment of the semiconductor packaging structure of the present invention.

FIG. 3 is a schematic view of a second embodiment of the semiconductor packaging structure of the present invention. The semiconductor packaging structure 3 of the second embodiment also comprises the following: a chip 31, a dielectric layer 33, a plurality of redistribution circuit layers 34, a protective layer 35 and a plurality of bumps 38. However, the semiconductor packaging structure 3 differs from the aforesaid semiconductor packaging structure 2 in that it further comprises a second dielectric layer 35 and a plurality of second redistribution circuit layers 36.

In detail, the second dielectric layer 35 is disposed on the redistribution circuit layers 34 and the dielectric layer 33. A plurality of second containers 351 is defined within the second dielectric layer 35. Similar to the containers 331, each of the second containers 351 also comprise a through portion 3511 and a blind portion 3512 so that the redistribution circuit layers 34 can be exposed from the second containers 351.

The second redistribution circuit layers 36 are disposed within the second containers 351 respectively to be surrounded by the second dielectric layer 35. As such, the bonding surfaces between the second redistribution circuit layers 36 and the second dielectric layer 35 can be remarkably increased. Furthermore, the second redistribution circuit layers 36 are electrically connected with the redistribution circuit layers 34 respectively.

In addition to the aforesaid differences, the positions of the protective layer 37 and the bumps 38 of the semiconductor packaging structure 3 are also different from those of the semiconductor structure 2.

In detail, the protective layer 37 is disposed on the second dielectric layer 35 and the second redistribution circuit layers 36. A plurality of recesses 371 extending through the protective layer 37 is also defined in the protective layer 37 so that the second redistribution circuit layers 36 can be exposed from the recesses 371 respectively. The bumps 38 are disposed within the recesses 371 and are in contact with and electrically connected with "the second redistribution circuit layers 36 exposed in the recesses 371" respectively. In this way, the bumps 38 can be electrically connected with the redistribution circuit layers 34 and the connection pads 32 indirectly.

Similar to the first embodiment, the semiconductor packaging structure 3 in some implementations may further comprise a plurality of UBM layers disposed between the second redistribution circuit layers 36 and the bumps 38.

From the above descriptions, the semiconductor packaging structure of the present invention is not limited to include only one combination of "dielectric layer and redistribution circuit layers", but may have more than one combinations of "dielectric layer and redistribution circuit layers" depending on practical applications. In addition, when several combinations of "dielectric layer and redistribution circuit layers" exist, it is unnecessary for the redistribution circuit layers to be recessed into the dielectric layer in every combination. In other words, as long as the redistribution circuit layers are recessed into the dielectric layer in one of the combinations of "dielectric layer and redistribution circuit layers", it can be regarded as falling within the scope of the present invention.

What have been described above are descriptions of the preferred embodiments of the semiconductor packaging structure of the present invention. Next, the manufacturing method of the semiconductor packaging structure of the present invention will be described, which at least can manufacture the aforesaid semiconductor packaging structure 2 and semiconductor packaging structure 3. However, it shall be appreciated that the semiconductor packaging structure of the present invention is not limited to be manufactured by the manufacturing method of the semiconductor packaging structure of the present invention.

Figure 4A:
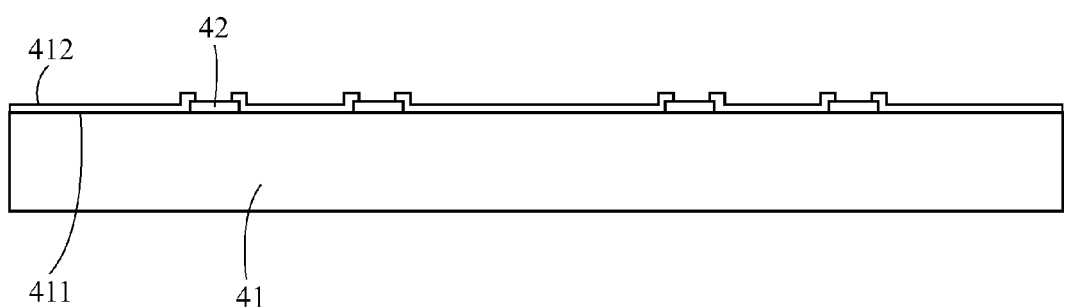
FIGS. 4A to 4J are schematic views that illustrate one of the steps of the first embodiment of the manufacturing method of the semiconductor packaging structure of the present invention.
Figure 4B:
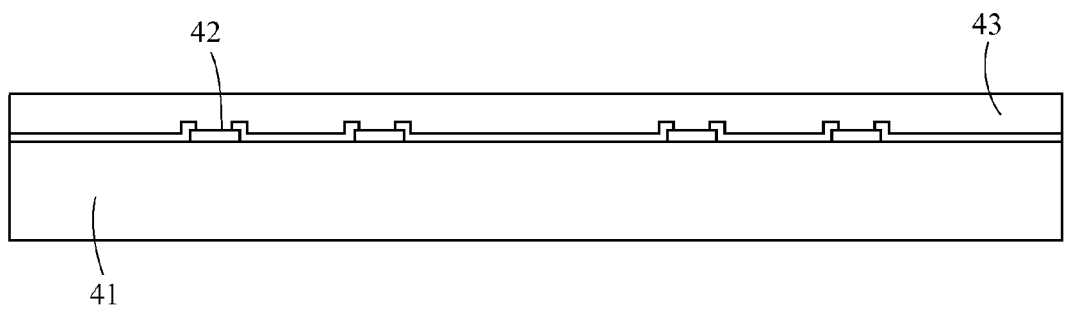
Figure 4C:
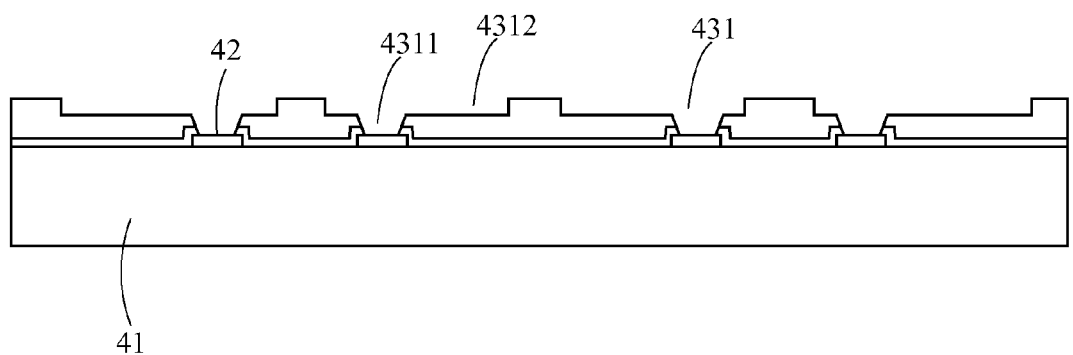
Figure 4D:
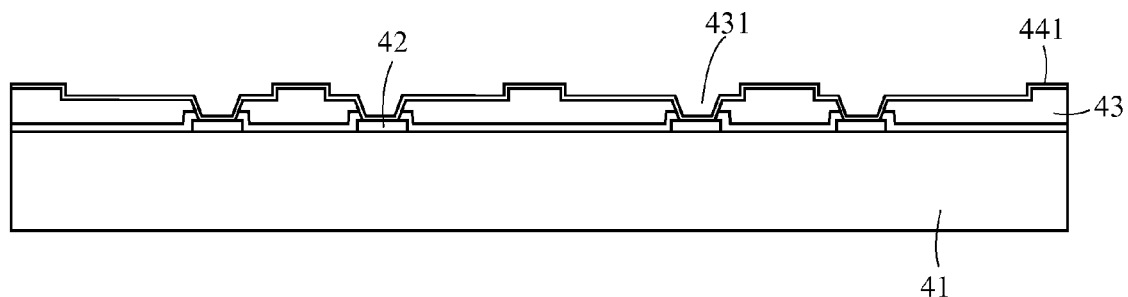
Figure 4E:
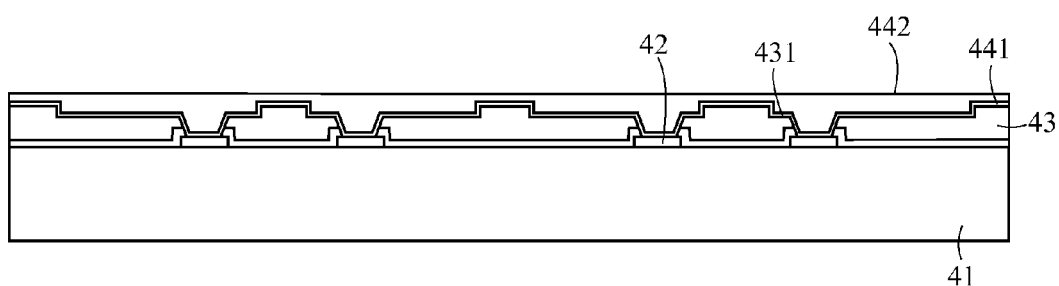
Figure 4F:
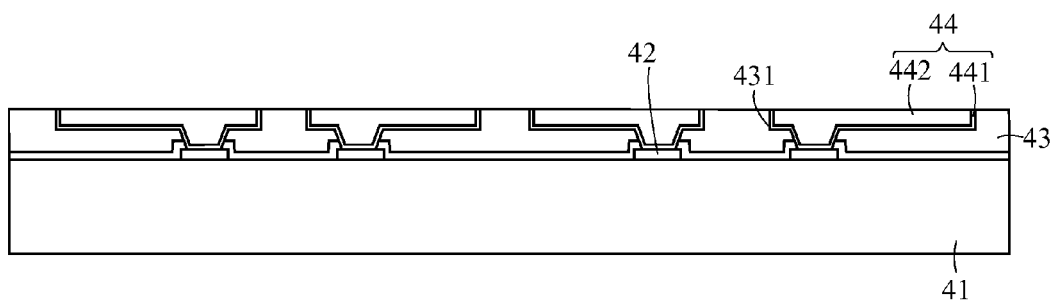
Figure 4G:
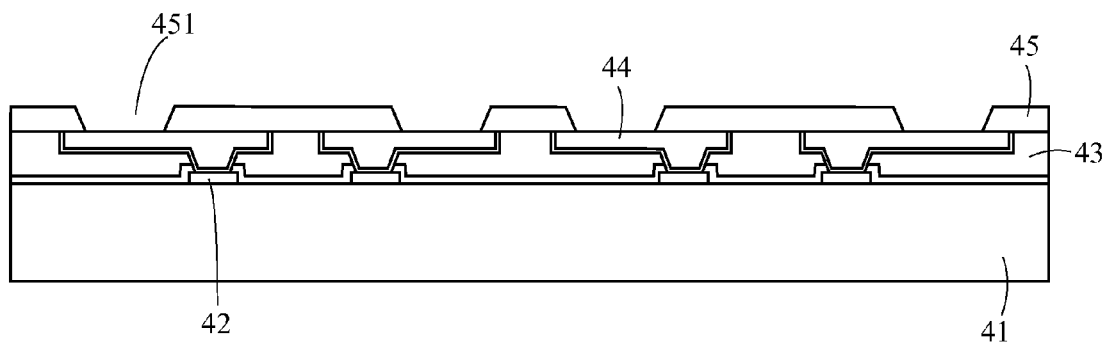
Figure 4H:
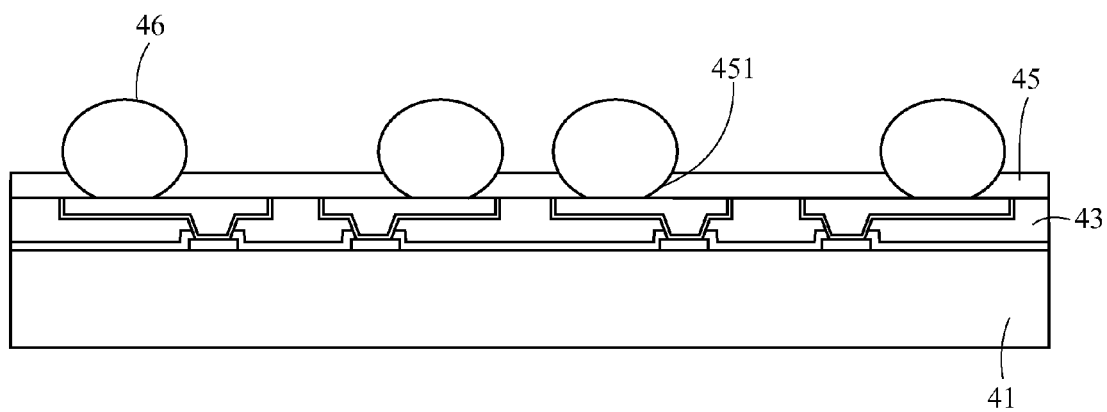
Figure 5:
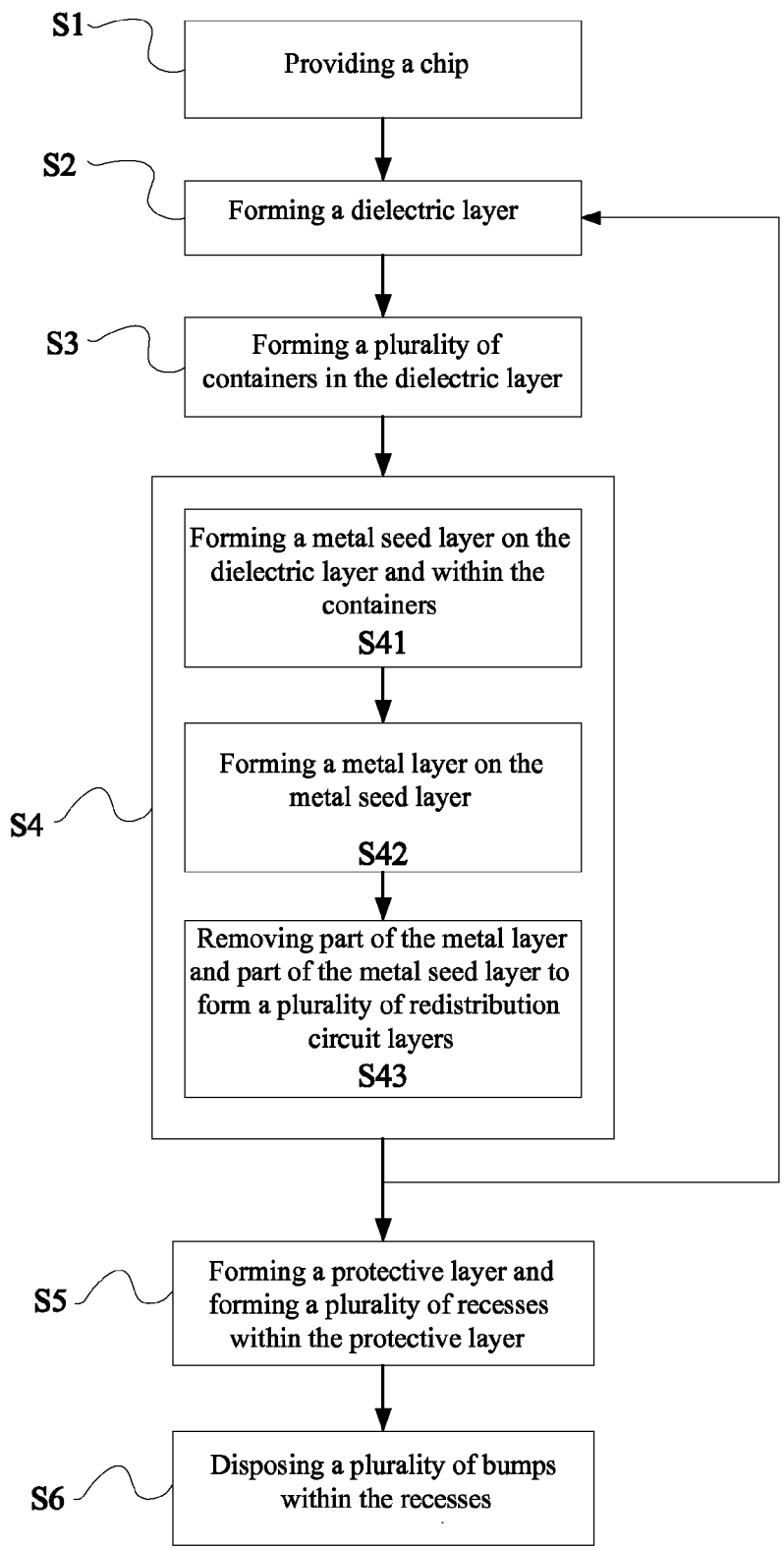
FIG. 5 is a flowchart diagram of the first embodiment of the manufacturing method of the semiconductor packaging structure of the present invention.

FIG. 5 is a flowchart diagram of the first preferred embodiment of the manufacturing method of the semiconductor packaging structure of the present invention. Each of FIGS. 4A to 4H is a schematic view of one of the steps of FIG. 5.

The manufacturing method may begin with step S1 (as shown in FIG. 4A) of providing a chip 41. The chip 41 may have a plurality of connection pads 42 and a protective layer 412 which are formed on the upper surface 411 of the chip 41, and the protective layer 412 covers the periphery of the connection pads 42. Then, as shown in step S2 and FIG. 4B, a dielectric layer 43 is formed on the chip 41 to cover the protective layer 412 and the connection pads 42 of the chip 41.

Next, as shown in step S3 and FIG. 4C, part of the dielectric layer 43 is removed to form a plurality of containers 431 in the dielectric layer 43. Each of the formed containers 431 may comprise a through portion 4311 and a blind portion 4312, and the through portions 4311 are located above the connection pads 42 so that the connection pads 42 can be exposed from the containers 431 respectively.

The removal of the dielectric layer 43 may be achieved by laser processing, press molding or etching. The removed amount of the dielectric layer 43 can be more precisely controlled by using the laser (e.g., excimer laser) processing. In this way, the size of the formed containers 431 can be well controlled and the errors are relatively small. Since the removed amount of the dielectric layer 43 can be precisely controlled, the distance between two containers 431 can be reduced.

After the containers 431 are formed, a plurality of redistribution circuit layers 44 is formed within the containers 431. The redistribution circuit layers 44 being in contact with and electrically connected with the connection pads 42 respectively, as shown in step S4 and FIG. 4F. The redistribution circuit layers 44 can be formed in various ways. In this embodiment, the redistribution circuit layers are formed in the following way.

First, as shown in step S41 and FIG. 4D, a metal seed layer 441 is formed within the containers 431 and on the dielectric layer 43 by sputtering or chemical plating. Then, as shown in S42 and FIG. 4E, a first metal layer 442 is formed on the metal seed layer 441 by electroplating, chemical plating or sputtering. The step S42 will stop as the first metal layer 442 is formed to a predetermined thickness. Generally, the first metal layer 422 formed is thicker than the metal seed layer 441. In this embodiment, the first metal layer 422 is formed to fill up the container 431. The metal seed layer 441 and the first metal layer 442 may be formed of copper or some other metal with good electrical conductivity.

Next, as shown in S43 and FIG. 4F, part of the first metal layer 442 and part of the metal seed layer 441 located on the upper surface of the dielectric layer 43 may be removed by etching back, grinding or laser processing, and so on. Thus, the metal layer 442 and the metal seed layer 441 remaining in each of the containers 431 can form the redistribution circuit layers 44 electrically isolated from each other.

Figure 4I:
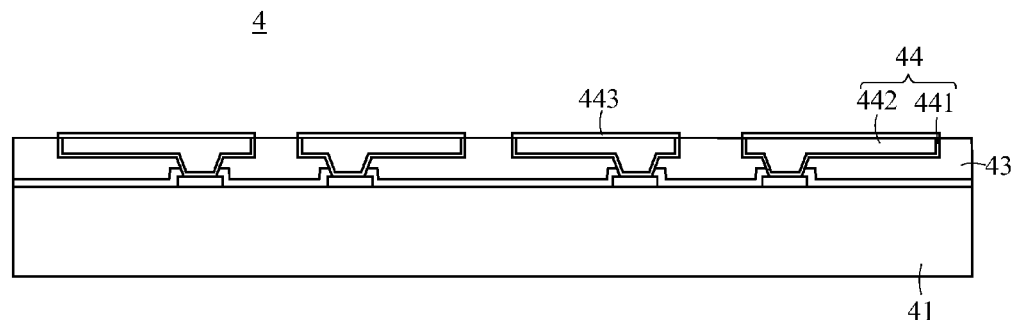

Moreover, as shown in FIG. 4I, the redistribution circuits may further be formed in the following way: after the aforesaid steps, a second metal layer 443 is further formed on the first metal layer 442 by performing electroplating or chemical plating on the first metal layer 442 for barrier purposes to prevent potential degradation in reliability of the first metal layer 442 due to subsequent processes. The second metal layer 443 may comprise a material (e.g., tin or titanium) different from that of the first metal layer.

It shall be appreciated that in addition to the aforesaid steps S41 to S43, the redistribution circuit layers 44 may also be formed by printing (e.g., screen printing). In this case, a metal material may be printed into the containers 431 directly to form the redistribution circuit layers 44. The metal material will not be printed on the dielectric layer 43, so no additional step is required to remove the metal material from the dielectric layer 43. The redistribution circuit layers 44 formed by printing may slightly protrude upward outside the containers 431, but this will not affect the subsequent processes.

After the redistribution circuit layers 44 are formed, a protective layer 45 is formed on the redistribution circuit layers 44 and the dielectric layer 43. Part of the protective layer 45 is removed to form a plurality of recesses 451 in the protective layer 45, as shown in step S5 and FIG. 4G. Because the recesses 451 extend through the protective layer 45 and are located above the redistribution circuit layers 44, the redistribution circuit layers 44 can be exposed from the recesses 451 respectively.

Figure 4J:
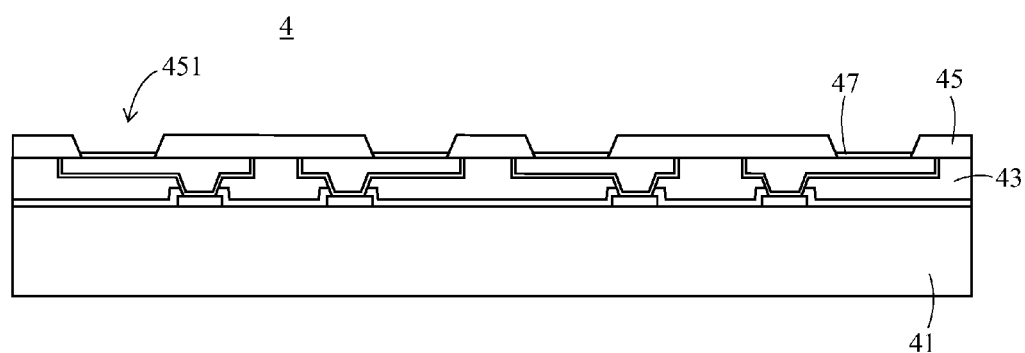

Then, as shown in step S6 and FIG. 4H, a plurality of bumps 46 is disposed within the recesses 451 to come into contact with and be electrically connected with "the redistribution circuit layers 44 exposed in the recesses 451" respectively. As shown in FIG. 4J, in step S6, a plurality of UBM layers 47 may further be formed within the recesses 451 to be connected with the redistribution circuit layers 44 before disposing the bumps 46. Then the bumps 46 are formed on the UBM layers 47 so that the bumps 46 are spatially separated from the redistribution circuit layers 44 but can be electrically connected to the redistribution circuit layers 44 through the UBM layers 47.

After step S6, a testing step and a dicing step (not shown) may further be performed sequentially. In detail, the testing step is performed to test for any damage or abnormal conditions of the integrated circuits within the chip, the wafer form or the panel form. The dicing step is performed to dice the chip, the wafer form or the panel form into a plurality of independent portions, each of which can form one semiconductor packaging structure.

It shall be appreciated steps S2 to S4 may be repeated for several times to form a plurality of combinations of "dielectric layer and redistribution circuit layers" on the chip.

According to the above descriptions, the semiconductor packaging structure of the present invention and the manufacturing method for the same may at least have the following features:

1. The redistribution circuit layers of the semiconductor packaging structure are partially or totally embedded into the dielectric layer, so the bonding area between the redistribution circuit layers and the dielectric layer is increased and the bonding force therebetween is increased.

2. Because the redistribution circuit layers are embedded into the dielectric layer, the overall thickness of the packaging structure can be decreased; or thicker redistribution circuit layers can be used to increase the conductivity while the thickness of the packaging structure remains unchanged.

3. During the manufacturing process of the semiconductor packaging structure, the containers can be formed by laser processing, so the size of the containers can be precisely controlled and the intervals between every two containers can be reduced. In this way, the size of the redistribution circuit layers formed within the containers can also be precisely controlled and the intervals between every two redistribution circuit layers can also be reduced.

4. During the manufacturing process of the semiconductor packaging structure, the alignment step, which is used for aligning the laser with the to-be-processed portion of the dielectric layer, may only need to be used in steps for forming the containers and need not be used in other subsequent processes, so the overall manufacturing time and cost are remarkably reduced.

5. A photolithography process is not required in the processes for forming the containers and the redistribution circuit layers.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a semiconductor packaging structure, the method comprising steps of:
   providing a chip which has a plurality of connection pads;
   providing a dielectric layer on the chip, wherein the dielectric layer covers the connection pads;
   removing parts of the dielectric layer to form a plurality of containers in the dielectric layer, each of the containers having a through portion and a blind portion, wherein the connection pads are exposed from the through portions of the containers, respectively; and
   forming a plurality of redistribution circuit layers within the through portions and the blind portions of the containers and electrically connecting the redistribution circuit layers with the connection pads, respectively, wherein the redistribution circuit layers are surrounded by the dielectric layer in the through portions and the blind portions;
   wherein step of forming a plurality of redistribution circuit layers within the containers further comprises: forming a first metal layer on the dielectric layer and within the containers, removing the first metal layer that is on the dielectric layer, and forming a second metal layer on the first metal layer, and the second metal layer is extending across the through portion of the container;
   wherein an entire upper surface of the first metal layer of each of the redistribution circuit layers and an upper surface of the dielectric layer are coplanar, and the second metal layer is formed on the entire upper surface of the first metal layer and above the dielectric layer.

2. The method of claim 1, wherein the step of forming a first metal layer on the dielectric layer and within the containers further comprises steps of:
   forming a metal seed layer, which is thinner than the first metal layer, on the dielectric layer and within the containers; and
   forming the first metal layer on the metal seed layer by electroplating, chemical plating or sputtering.

3. The method of claim 1, wherein the removal of the first metal layer that is on the dielectric layer comprises grinding or etching.

4. The method of claim 1, wherein the removal of the dielectric layer comprises laser processing, press molding or etching.

5. The method of claim 1, wherein the step of forming a plurality of redistribution circuit layers within the containers further comprises a step of:
   printing a metal material into the containers, so as to form the redistribution circuit layers.

6. The method of claim 1, further comprising:
   forming a protective layer on the dielectric layer and the redistribution circuit layers;
   and removing parts of the protective layer, so as to form a plurality of recesses within the protective layer, wherein the redistribution circuit layers are exposed from the recesses, respectively.

7. The method of claim 6, further comprising:
   forming a plurality of under-bump-metal (UBM) layers within the recesses, and electrically connecting the UBM layers with the redistribution circuit layers respectively; and disposing a plurality of bumps on the UBM layers, and electrically connecting the bumps with the redistribution circuit layers via the UBM layers respectively.

8. A semiconductor packaging structure, comprising:
a chip having a plurality of connection pads;
a dielectric layer disposed on the chip, wherein a plurality of containers are defined within the dielectric layer, each of the containers has a through portion and a blind portion, and the connection pads are exposed from the through portions of the containers, respectively; and
a plurality of redistribution circuit layers disposed within the through portions and the blind portions of the containers and electrically connected with the connection pads, respectively, wherein the redistribution circuit layers are surrounded by the dielectric layer in the through portions and the blind portions;
wherein each of the redistribution circuit layers includes a first metal layer and a second metal layer, and the second metal layer is formed on the first metal layer and extending across the through portion of the container;
wherein an entire upper surface of the first metal layer of each of the redistribution circuit layers and an upper surface of the dielectric layer are coplanar, and the second metal layer is formed on the entire upper surface of the first metal layer and above the dielectric layer.

9. The structure of claim 8, wherein each of the redistribution circuit layers further includes a metal seed layer, and the first metal layer is formed on the metal seed layer.

10. The structure of claim 8, further comprising:
a protective layer disposed on the dielectric layer,
wherein
a plurality of recesses are defined within the protective layer, and
the redistribution circuit layers are exposed from the recesses, respectively.

11. The structure of claim 10, wherein the recesses are offset from the connection pads, respectively.

12. The structure of claim 10, further comprising;
a plurality of under-bump-metal (UBM) layers; and
a plurality of bumps,
wherein
the UBM layers are disposed within the recesses, respectively, and
the bumps are disposed on the UBM layers, respectively, and electrically connected with the redistribution circuit layers via the UBM layers, respectively.

13. The structure of claim 8, further comprising:
a second dielectric layer disposed on the redistribution circuit layers and the dielectric layer, wherein a plurality of second containers are defined within the second dielectric layer, each of the second containers has a through portion and a blind portion, and the redistribution circuit layers are exposed from the through portions of the second containers, respectively; and
a plurality of second redistribution circuit layers disposed within the through portions and the blind portions of the second containers and electrically connected with the redistribution circuit layers, respectively, wherein the second redistribution circuit layers are surrounded by the second dielectric layer.

14. The structure of claim 13, further comprising;
a protective layer disposed on the second dielectric layer,
wherein
a plurality of recesses are defined within the protective layer, and
the second redistribution circuit layers are exposed from the recesses, respectively.

15. The structure of claim 14, further comprising;
a plurality of under-bump-metal (UBM) layers; and
a plurality of bumps,
wherein
the UBM layers are disposed within the recesses, respectively, and
the bumps are disposed on the UBM layers, respectively, and electrically connected with the second redistribution circuit layers via the UBM layers, respectively.

* * * * *